US007894564B2

(12) United States Patent
Hsiao-Chyi

(10) Patent No.: US 7,894,564 B2
(45) Date of Patent: *Feb. 22, 2011

(54) PHASE MODULATION METHOD FOR SPREAD SPECTRUM CLOCK GENERATOR

(75) Inventor: Lin Hsiao-Chyi, Hsin-Tien (TW)

(73) Assignee: VIA Technologies, Inc., Taipei (TW)

( * ) Notice: Subject to any disclaimer, the term of this patent is extended or adjusted under 35 U.S.C. 154(b) by 978 days.

This patent is subject to a terminal disclaimer.

(21) Appl. No.: 11/737,467

(22) Filed: Apr. 19, 2007

(65) Prior Publication Data

US 2008/0107154 A1 May 8, 2008

Related U.S. Application Data

(60) Provisional application No. 60/864,639, filed on Nov. 7, 2006, provisional application No. 60/868,362, filed on Dec. 4, 2006.

(51) Int. Cl.
*H03D 3/24* (2006.01)

(52) U.S. Cl. ...................................... 375/375

(58) Field of Classification Search ................ 375/130, 375/238, 239, 242, 271, 346, 354, 371, 373, 375/374, 375, 376; 327/100, 141, 144, 146, 327/147, 148, 162, 163, 164; 332/117, 123, 332/126, 127, 144
See application file for complete search history.

(56) References Cited

U.S. PATENT DOCUMENTS 5,488,627 A   1/1996  Hardin et al.

6,731,667 B1 *  5/2004  Lee et al. ............ 375/130
6,744,277 B1 *  6/2004  Chang et al. .......... 326/37
7,095,260 B2 *  8/2006  Miyata et al. .......... 327/156
2002/0171457 A1 * 11/2002  Fujiwara .............. 327/113

FOREIGN PATENT DOCUMENTS

WO   WO2005/117267   12/2005

OTHER PUBLICATIONS

Hardin et al. "Spread Spectrum Clock Generation for the Reduction of Radiated Emissions." IEEE International Symposium on Electromagnetic Compatibility. pp. 227-231 Aug. 1994.
Kim et al. "Spread Spectrum Clock Generator With Delay Cell Array to Reduce Electromagnetic Interference." IEEE Transactions on Electromagnetic Compatibility. vol. 47, No. 4, Nov. 2005. pp. 908-920.

* cited by examiner

*Primary Examiner*—David C Payne
*Assistant Examiner*—Vineeta S Panwalkar
(74) *Attorney, Agent, or Firm*—James W. Huffman

(57) ABSTRACT

Spread spectrum clock generation (SSCG) using phase modulation. A first clock signal having a first frequency spectrum may be modulated using phase modulation to produce a second clock signal. The phase modulation may include providing a phase modulation profile corresponding to the integrated frequency modulation profile, to adjust a scaling factor used in obtaining the second clock signal. The phase modulation profile may be provided in the form of a pulse or pulses, which may be injected through pulse density modulation or pulse width modulation at the output of a phase frequency detector comprised in a phase locked loop circuit used in generating the second clock signal. This modified phase modulation technique removes the down spread limitation present in traditional PM implementations, and also provides better jitter performance and lower cost than traditional PM implementations.

20 Claims, 3 Drawing Sheets

PHASE MODULATION METHOD FOR SPREAD SPECTRUM CLOCK GENERATOR

PRIORITY CLAIM

This application claims benefit of priority Provisional Application Ser. No. 60/864,639 titled "A New Phase Modulation Method For Spread Spectrum Clock Generator", and filed on Nov. 7, 2006, whose inventor is Hsiao-Chyi Lin. This application further claims benefit of priority Provisional Application Ser. No. 60/868,362 titled "A New Phase Modulation Method For Spread Spectrum Clock Generator", and filed on Dec. 4, 2006, whose inventor is Hsiao-Chyi Lin. Provisional Application Ser. No. 60/864,639 and Ser. No. 60/868,362 are both hereby incorporated by reference as though fully and completely set forth herein.

FIELD OF THE INVENTION

The present invention generally relates to performing spread spectrum clock generation (SSCG) in electrical devices, and more particularly to performing SSCG using a new phase modulation (PM) method, to solve down spread limitation and get better jitter performance at a lower cost than traditional PM implementations.

DESCRIPTION OF THE RELATED ART

In synchronous digital systems, the clock signal used to drive the system is oftentimes one of the major sources of EMI (electromagnetic interference). Because of its periodic nature, a clock signal has an unavoidably narrow frequency spectrum. In fact, a perfect clock signal would have all its energy concentrated at a single frequency and its harmonics, and would therefore radiate energy with an infinite spectral density. Practical synchronous digital systems radiate electromagnetic energy on a number of narrow bands spread on the clock frequency and its harmonics, resulting in a frequency spectrum that, at certain frequencies, exceeds the regulatory limits for EMI (e.g. those of the Federal Communications Commission (FCC) in the United States, JEITA in Japan and the IEC in Europe), leading to additional design requirements aimed at bringing EMI emissions to within the allowed limits.

Thus, spread-spectrum clock generation (SSCG) is used in the design of synchronous digital systems, especially those containing microprocessors, to reduce the spectral density of the EMI generated by these systems. SSCG, which is oftentimes a special case of wide-band FM (frequency modulation), can efficiently lower the fundamental and higher-order harmonics of the clock signal, e.g., reduce the peak radiated energy of the clock signal, to effectively reduce EMI emissions. SSCG thus reshapes the system's electromagnetic emissions to comply with EMC (electromagnetic compatibility) regulations.

SSCG does not reduce the total energy radiated by the system, but rather spreads the energy over a large frequency band, which effectively reduces the electrical and magnetic field strengths that are measured within a narrow window of frequencies. Spread spectrum clocking works because EMI receivers used by EMC testing laboratories divide the electromagnetic spectrum into frequency bands approximately 120 kHz wide. If the system under test were to radiate all of its energy at one frequency, then this energy would fall into a single frequency band of the receiver, which would register a large peak at that frequency. Spread-spectrum clocking distributes the energy so that it falls into a large number of the receiver's frequency bands, without putting enough energy into any one band to exceed the statutory limits.

In SSCG, the modulation profile determines the power spectrum of the frequency-modulated clock. One nonlinear modulation profile is known as the "Hershey-Kiss" profile, which was proposed by K. B. Hardin, J. T. Fessler, D. R. Bush, "Spread Spectrum Clock Generation for the Reduction of Radiated Emissions," IEEE International Symposium on Electro-magnetic Compatibility, pp. 227-231, August 1994. The "Hershey-Kiss" profile shows good spreading, but its non-linear profile complicates the circuit implementation. Another widely used and implemented profile is a symmetric triangular profile.

FIG. 1 shows a system diagram that illustrates a variety of prior art SSCG methods in the context of a phase-locked loop (PLL) circuit 100. As part of a first method that uses a frequency modulation (FM) inside PLL 100, a capacitor may be configured to control oscillator 102 to produce a spread spectrum clock, with the frequency of the (spread spectrum) clock tracked by PLL 100. The first method may also implement a triangular wave to produce a frequency modulation profile, since triangular waves typically provide the best spread spectrum outcome when employing frequency modulation profiles, providing the highest attenuation and a flat spectrum. Most SSC specifications, such as SATA, PCIE, prescribe triangular waves for the waveforms used in performing frequency modulation. In the first method, the bandwidth of loop filter LPF 110 ranges from $\frac{1}{10}$ of the input reference frequency to 5-to-7 times the modulation frequency.

A second method utilizing FM inside PLL 100 includes controlling voltage $V_c$ or a node on low-pass filter LPF 110 to provide an analog modulation profile, thereby modulating the frequency of VCO (voltage controlled oscillator) 112 directly. When employing this method, it is typically more difficult to accurately control the linearity of the modulation profile due to the use of analog signals. Because the analog signal is injected into VCO 112 from LPF 110, a high-pass path to the VCO has to be provided for the modulation signal, to allow VCO 112 to be modulated directly, while the loop feedback signal is filtered to maintain the modulation profile. Since $V_c$ represents a bandpass node in PLL 100—placing a limitation on the bandwidth—a large capacitance value may be required in LPF 110. One main advantage of the second method is circuitry simplicity.

A third method employs phase modulation (PM) performed outside the loop of PLL 100, and includes delaying the VCO 112 output phase, moving the output phase by changing the length of the post delay line or multi-phase of VCO 112, via delay line array/mux (multiplexer) 114. In other words, method 3 operates to change phase directly to produce a PM equivalent to the FM. One advantage of this method is that LPF 110 is not affected by the modulation profile, and the required circuitry (e.g. delay line array/mux) is inherently simple. However, it tends to produce a noisy output as it bypasses LPF 110, and since delay line 114 is limited, practical implementations exist for the center spread, while practical down-spread or up-spread implementations are most of the time not available at all.

A fourth method involves multiplexing the multi-phase output of VCO 112 via multiplexer 116 to shift the output phase, while performing PM inside the loop of PLL 100. In the fourth method, different VCO phases are selected within the loop of PLL 100. However, the oscillation frequency of VCO 112 typically far exceeds the input reference frequency (because N>1), resulting in a phase rotation of several periods due to the back of a wide enough spread of the phase of VCO 112, or the period of VCO 112 not being long enough. Also, the fourth method is generally difficult to implement. In addition, similar to the third method, only the center spread can be implemented, it is not possible to implement a down spread or an up spread.

A fifth method involves performing common frequency modulation inside the loop of PLL 100, with a frequency synthesizer altering the value of N to change the oscillation frequency of VCO 112, typically through a sigma delta modulator 118. Because the fifth method includes sigma delta modulation (SDM), LPF 110 has to feature a low bandwidth with a large capacitance to filter out the quantization noise resulting from the SDM process. This renders the implementation of the fifth method complex, having to take into consideration various system level aspects in addition to the design considerations of the SSCG circuit itself.

Therefore, an improved method is desired for performing spread spectrum clock generation (SSCG) using to reduce electromagnetic interference (EMI).

SUMMARY OF THE INVENTION

Various embodiments are described of a system and method for performing spread spectrum clock generation (SSCG) to reduce electromagnetic interference (EMI). In one embodiment, spread spectrum clock generation (SSCG) is performed using phase modulation (PM) without the down spread limitation present in traditional PM implementations, and with better jitter performance and lower cost than traditional PM implementations.

In one set of embodiments, to produce a down spread result using a PM method, a nominal PLL frequency may be divided by a denominator N, shifting the initial oscillator frequency, to obtain a center spread implementation that is equivalent to a down spread modulation. To accomplish this, a phase modulation profile pulse may be injected after the PFD (phase frequency detector) in a PLL (phase-locked loop) to provide a phase modulation profile representing the integrated frequency modulation profile. The phase modulation profile pulse may be produced and inserted via pulse density modulation (PDM) or pulse width modulation (PWM), to have the PLL loop track the inserted pulse to adjust its oscillation frequency, and achieving the required frequency modulation profile. By performing pulse modulation inside the PLL loop, the advantages of PM modulation may be coupled with the capability of filtering the modulated signal to obtain a better output clock with lower jitter.

The functional behavior of the PLL may still be characterized by, and may be consistent with operational changes that take place when a value of N in the integrating feedback loop is scaled to affect a change in frequency. In one set of embodiments, the scaling of N may be performed by inserting a phase error into the PFD whenever the value of N is to be modified. The adjustment of the value of N may therefore be performed by injecting a previously specified phase error at the output of the PFD according to the integration result of the modulation profile. The speed of the PFD may be kept at a level allowing proper insertion of the phase modulation profile pulse. The phase insertion after the PFD may be performed to inject a PFD output phase error for every modulation period and utilize a phase profile identical to the second order integration curve from the frequency modulation profile.

In one set of embodiments, the specified phase error pulse, or phase modulation profile pulse, may be obtained/generated based on a counter or a lookup table. As long as the inserted phase can be accurately calculated, good linearity may be obtained. The bandwidth may be specified to be considerably less than the operating frequency of the PFD, since the PLL may be updated at a speed commensurate with the operating speed of the PFD. A third pole may be added into the LPF (loop filter of the PLL) for a three-stage loop filter operable to filter out any input reference spur that may occur. In alternate embodiments, the operating speed of the PFD may be raised to ensure that the required value of the capacitor in the loop filter is not very large.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
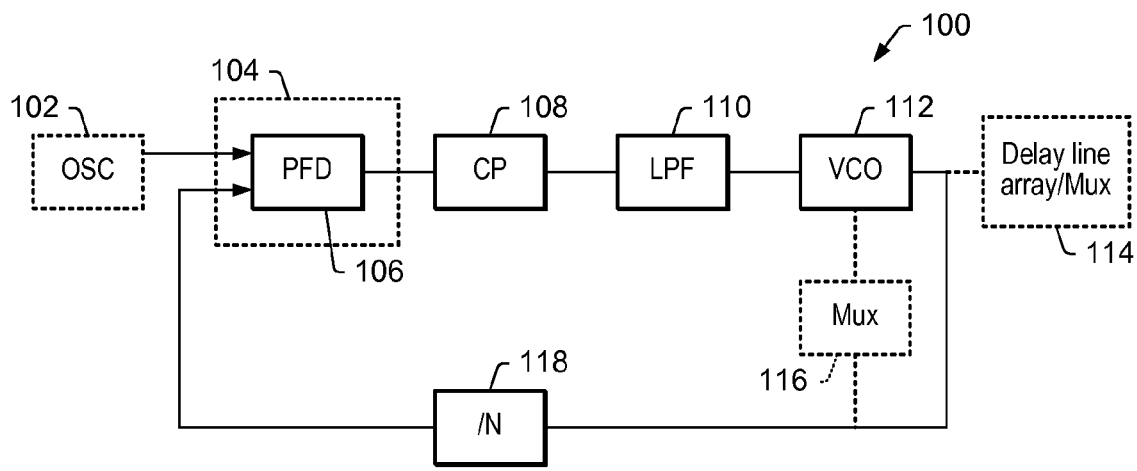
FIG. 1 shows a phase-locked loop (PLL) implementing a variety of spread spectrum clock generation (SSCG) methods according to prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to".

DETAILED DESCRIPTION OF THE EMBODIMENTS

There are two major methods or types of methods typically used to implement spread spectrum in a PLL (phase-locked loop) clock generator. One algorithm is based on phase modulation (PM) while the other is based on frequency modulation (FM). Due to the integration/differentiation relationship between frequency and phase—frequency may be integrated to obtain phase, while phase may be differentiated to obtained frequency—the same modulation results in the frequency domain (spectrum) may be mathematically obtained by either directly modulating a PLL's frequency via frequency modulation, or modulating it via phase modulation and keeping the phase related to the frequency through integration. However, also taking into account circuit design and implementation considerations, solutions that employ phase modulation may theoretically be preferred over solutions that employ frequency modulation, due to better jitter performance of the PM method resulting from the direct modulation of the phase, thus gaining direct control during the design process over limiting jitter generation. In other words, jitter generation may be bounded by the design when designing for phase modulation.

Typically, when modulating the frequency, due to the tracking feature of the PLL, the frequency variation will get integrated to obtain a phase output, leading to sizeable and unbounded jitter. However, when performing bounded phase integration, only a center spread is possible in PM solutions. Unfortunately, most spread spectrum specification standards such as SATA and PCIE require down spread implementations, leading to most SSCG (spread spectrum clock generation) being performed using FM, many times at considerably increased system costs as a result.

Figure 2:
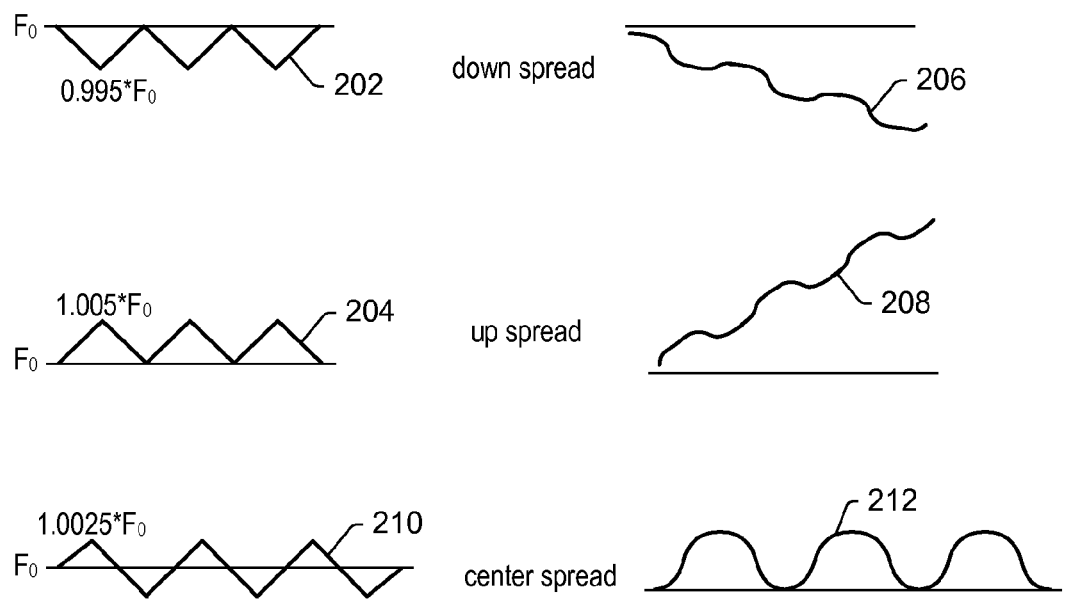
FIG. 2 shows frequency waveforms (left) and corresponding phase waveforms (right) partially illustrating the operation of the SSCG PLL of FIG. 1, according to prior art.

FIG. 2 shows the spreads for some typical PM and FM implementations. For example, typical PM implementations may produce the center spread illustrated by waveform 212 (based on modulating waveform 210), but it may not be possible to produce the down spread illustrated by waveform 206 (based on modulating waveform 202) and/or the up spread illustrated by waveform 208 (based on modulating waveform 204), using phase modulation.

Figure 4A:
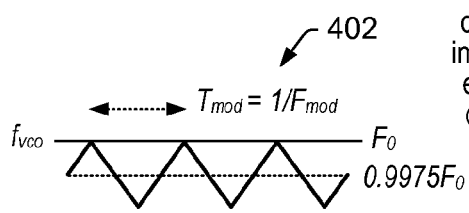
FIGS. 4A-4D show phase/frequency modulation waveforms partially illustrating the operation of the PLL of FIG. 3, according to one embodiment of the present invention.
Figure 4B:
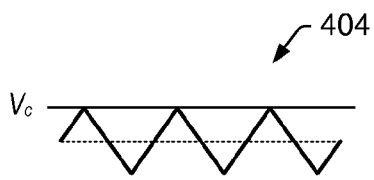
Figure 4C:
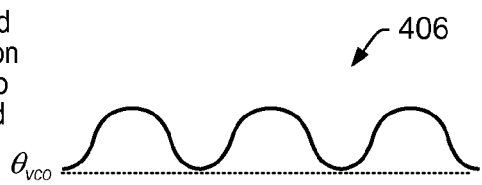

In one set of embodiments, to produce a down spread result using a PM method, a nominal PLL frequency may be divided by a denominator N, shifting the initial oscillator frequency, to accomplish a center spread implementation that is equivalent to a down spread modulation. This is illustrated in FIGS. 4A and 4C, where waveform 406 is based on modulating waveform 402, with the modulating waveform having been shifted down, effectively shifting the initial oscillator frequency $F_0$. Note that the numerical coefficients in FIG. 2 are given for illustrative purposes only, and that $F_0$ may be shifted by amounts different than those shown.

Figure 3:
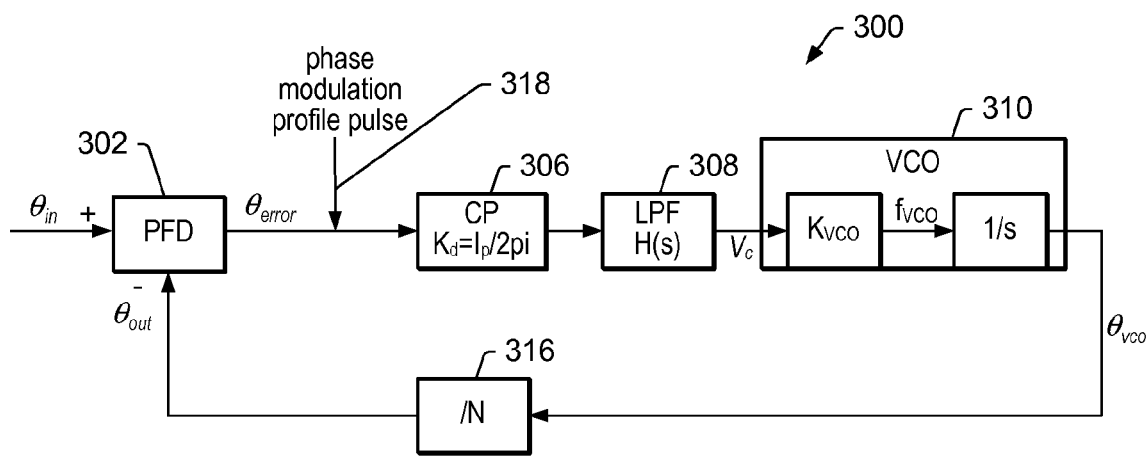
FIG. 3 shows a PLL implementing an SSCG method according to one embodiment of the present invention.

FIG. 3 shows a system diagram illustrating a spread spectrum method different from the five methods previously described in conjunction with FIGS. 1 and 2. A PLL 300 may include a PFD (phase frequency detector) 302 providing a phase error signal to charge pump (CP) 306, the output of which may pass through loop filter 308, which may be a low-pass filter (LPF), the signal reaching voltage controlled oscillator (VCO) 310. The output of VCO 310 may be fed back to PFD 302 through an divider 316 having a value of N. In one embodiment, a phase modulation profile pulse 318 is injected after PFD 302 to provide a phase modulation profile corresponding to the integrated frequency modulation profile. Phase modulation profile pulse 318 may be produced and inserted via pulse density modulation (PDM) or pulse width modulation (PWM), among other methods, to ensure that PLL loop 300 tracks the inserted pulse 318 (phase) and adjusts its oscillation frequency to achieve the required frequency modulation profile. By employing pulse modulation inside PLL loop 300, full use may be made of the advantages of PM modulation, while also utilizing loop filter 308 in PLL 300 to filter the modulated signal to obtain a better output clock with lower jitter.

It should be noted (as also previously mentioned) that most current SSCG implementations involve one or more of the methods previously described and shown in FIG. 1. Considering the behavioral model of PLL 100 and PLL 300, changing the value of N to change the frequency (e.g. as performed in the fifth method described for PLL 100 in FIG. 1), may be performed by inserting a phase error into PFD 302 whenever the value of N is to be modified. In one set of embodiments, this behavioral property may allow simplifying the adjustment of the value of N in the SDM (sigma-delta modulator) by performing the adjustment through injecting a previously specified phase error after PFD 302 as shown in FIG. 3, i.e., by inserting a phase modulation profile pulse 318 after PFD 302 according to the integration result of the modulation profile (since the phase modulation profile may be obtained by integrating the frequency modulation profile).

In preferred embodiments, the speed of PFD 302 may be kept at a level that allows proper insertion of pulse 318. For example, the input speed $T_{input}$ (PFD 302 speed TPFD) having a value that is no less than the maximum extra phase may allow for pulse 318 to be inserted to change the value of N. In other words, a maximum PFD 302 speed criterion may be set as: TPFD>maximum extra phase. In one set of embodiments, PFD 302 may be operated at 10 MHz, with a period of 100 ns. Other embodiments may include a PFD operated at different frequencies. Thus, for the example of 10 MHz, a maximum extra phase of around 20 ns may still fall within the range for which pulse 318 may be inserted after PFD 302.

Figure 4D:
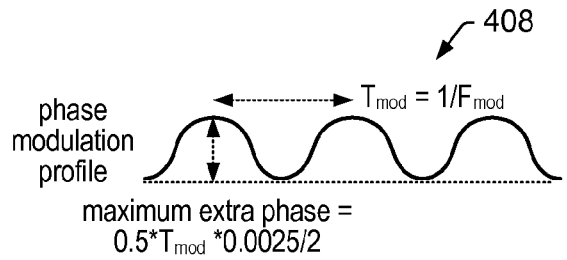

In principle, the phase insertion after PFD 302 may be performed to inject a PFD output phase error for every modulation period $T_{mod}$, and utilize a phase profile (pulse width) identical to the second order integration curve from the frequency modulation profile. This may result in a periodic quadratic curve increasing from a smaller value to a larger value, then decreasing from the larger value back down to a smaller value, with the maximum extra phase approximately equaling $0.5*T_{mod}*0.0025/2$. FIGS. 4A-4B show timing diagrams illustrating part of the operation of PLL 300. As previously mentioned, FIG. 4A shows (triangular wave) frequency modulation profile 402, with initial frequency $F_0$, and the resulting phase profile of (the output of) VCO 310. FIG. 4B shows the voltage waveform of voltage $V_C$ at the input of VCO 310, with the corresponding phase modulation profile shown in FIG. 4D.

In one set of embodiments, the specified phase error pulse, or phase modulation profile (signal) pulse, may be obtained/generated based on a counter or a lookup table. Since the output of PFD 302 is a digital signal, as long as the inserted phase can be accurately calculated, good linearity may be expected. For example, if the frequency with which pulse 318 is inserted is $F_{pulse}$ (e.g. the speed of PFD 302 may be 10 MHz), $F_{pulse}$ may be divided into $F_{pulse}/F_{mod}$ for each modulation period, injecting each corresponding value of the pulse on the quadratic curve. The bandwidth of PLL 300 may be selected to be 5 to 7 times that of $F_{mod}$, such that the tone with $5*F_{mod}$ to $7*F_{mod}$ modulation frequency can pass through, resulting in the PLL's tracking a waveform close to the required frequency modulation profile without severe slewing. In one set of embodiments, the bandwidth may be specified to be considerably less than the operating frequency of PFD 300, since PLL 300 may be updated at a speed commensurate with the operating speed of PFD 302. It is undesirable for the input reference tone produced by PFD 302 for updates to interfere with the modulation profile, thus it may be preferable to filter out the input reference spur. A third pole may be added into LPF 308 for a three-stage loop filter operable to filter out the input reference spur. In another set of embodiments, when saving layout area may also be a concern, it may be preferable to raise the operating speed of PFD 302 to ensure that the required value of the capacitor in the loop filter is not very large.

Figure 5:
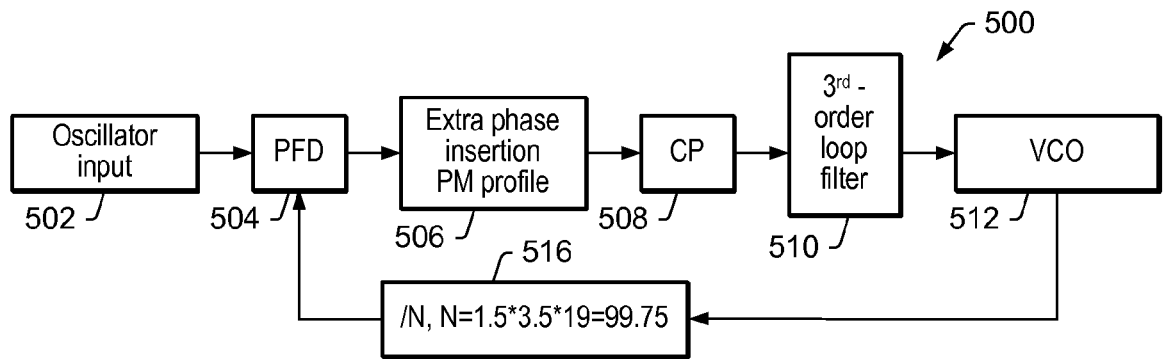
FIG. 5 shows a more specific embodiment of a PLL implementing an SSCG method according to one embodiment of the present invention.

Considering the PCIE specification for example, a reference clock of 100 MHz provided with a down spread having 0.5% tolerance and the center frequency shifted to 99.75 MHz may be considered equivalent to the center spread modulation approach, but providing a PM solution with better performance, using simple digital circuitry. In one set of embodiments, all fractional divisions in the circuit may be implemented using double edge triggered DFF (D Flip-Flops). FIG. 5 shows one embodiment of a PLL loop 500 implemented using an extra phase insertion profile 506 that is configured between PFD 504 and CP 508, with a third-order loop filter 510 providing filtering of at least the input reference spur before the signal reaches VCO 512. In the example shown, the oscillator may provide an input periodic signal of 10 MHz to PFD 504, with a resulting scaled up VCO output of 0.9975 GHz, scaled via divider 516.

In the embodiment shown, the pulse-width resolution used by the pulse insertion may be 1/2.4 G, or around 420 ps. By sampling the digital pulse width, the integration value obtained may be considered to be equivalent to an integration value obtained from a continuous (analog) timing waveform. Thus, a finer pulse width resolution may provide better performance with results that are closer to the ideal continuous timing waveform. The better performance may include smoother modulation profile, and less jitter. However, very fine pulse width resolution may also result in higher cost, leading to design trade offs. In the embodiment shown, the maximum extra phase may be set around 20 ns, with a pulse width resolution around 420 ps, resulting in the maximum value of 20 n/420 ps, that is, approximately 48 unit-length pulses, requiring only a total of 6 bits of resolution. In one embodiment, the pulses are applied through a PDM process, and the unit-length of each pulse is fixed, injecting a different number of pulses each time. In another embodiment, the pulses are applied through a PWM process, injecting a single pulse each time, but altering the pulse length each time a pulse is injected. When considering the PCIE specifications, the modulating frequency may be set in the 30~33 kHz range, e.g. a 31.25 kHz modulating frequency may be used, with each modulation period divided into 10 M/31.25 k=320 smaller intervals distributed evenly within the modulation period. Each sample within the 320 intervals may correspond to an optimal value among the 0~48 levels according to the integrated phase profile. In one set of embodiments, the calculated value may be written into a ROM (read-only memory), and a corresponding pulse-width value may be read from the ROM to inject at the output of the PFD (e.g. PFD 302 and/or PFD 504) according to the speed of the PFD, for each PFD period. It should be noted at this time that numerous approaches to inject a pulse have been provided above to allow for the selection of the most economic approach as appropriate. Other approaches, besides PDM and PWM, may also be possible and are contemplated, and alternate embodiments may preferably use one of the other approaches to inject the pulse phase modulation profile pulse.

Figure 6:
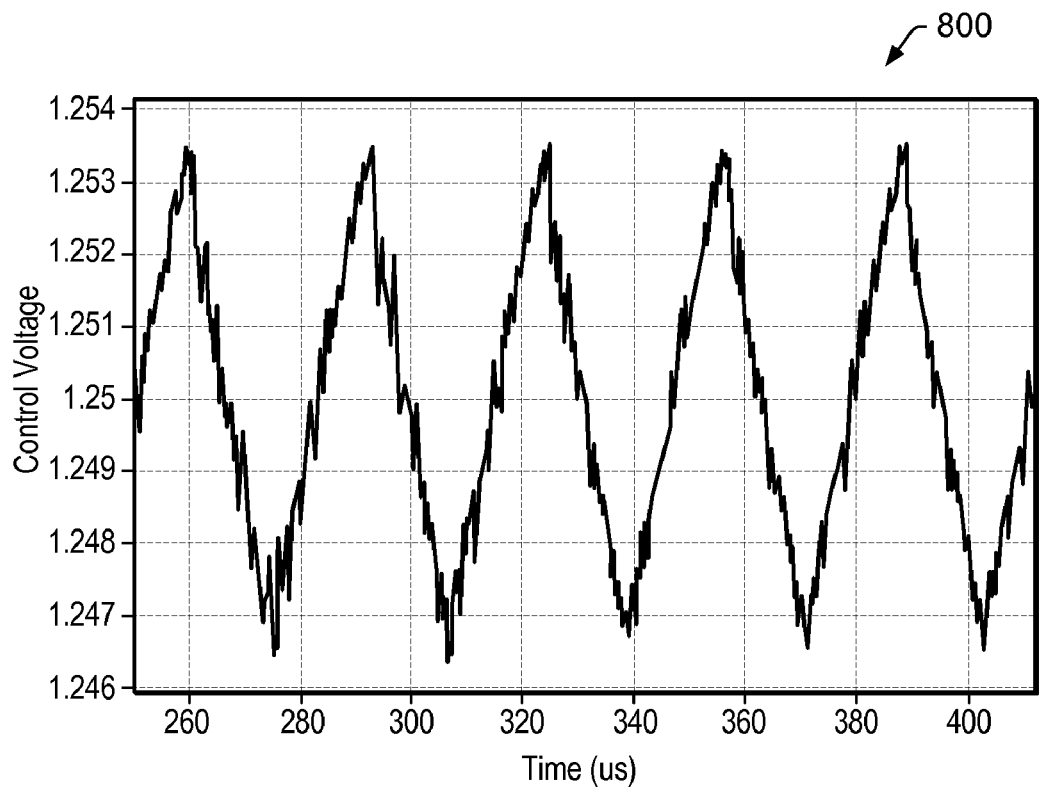
FIG. 6 shows a voltage waveform representing the control voltage applied at the input of the voltage controlled oscillator (VCO) in the embodiment of FIG. 5.
Figure 7:
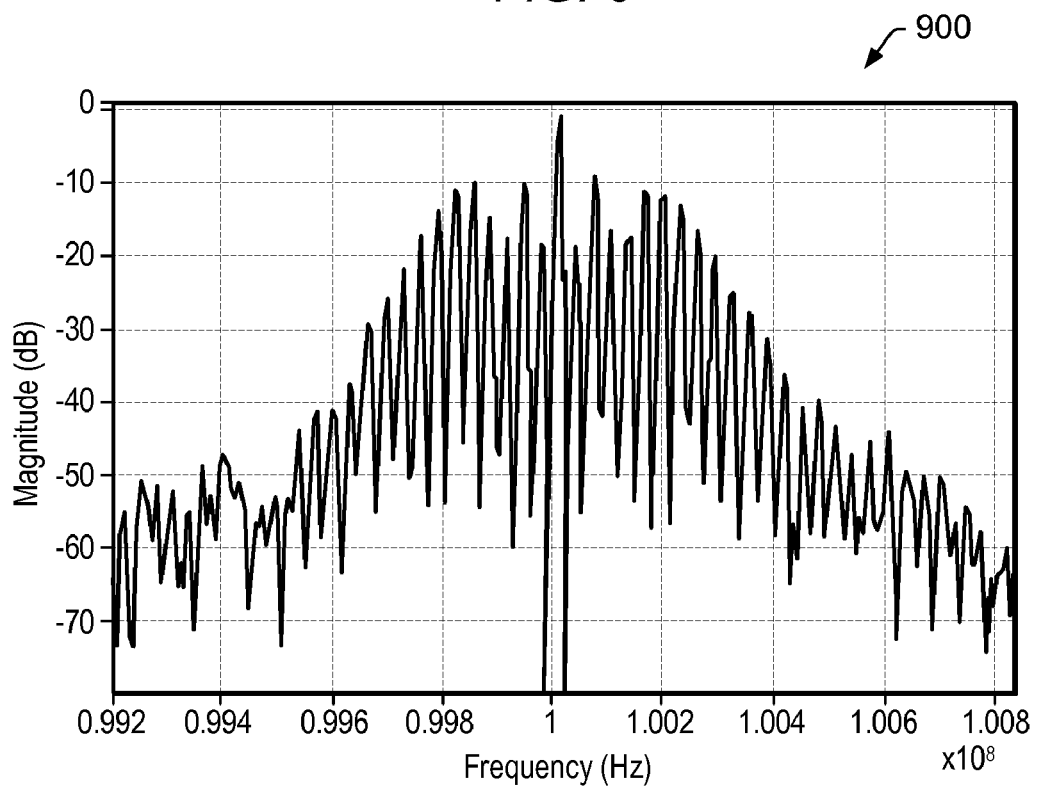
FIG. 7 shows a frequency spectrum diagram for the control voltage waveform shown in FIG. 6 when performing an SSCG according to one embodiment of the present invention.

FIGS. 6 and 7 show simulation results of the control voltage and frequency spectrum of the control voltage for the embodiments shown in FIGS. 3 and 5. For the control voltage $V_C$ shown in FIG. 6, (where $V_C$ may be the control input voltage to VCO 310 and/or VCO 512, for example), the frequency spectrum is shown in FIG. 7. The spike at the center frequency represents the frequency spectrum prior to performing clock spreading, while the rest of the spikes represent the spread spectrum obtained utilizing the PM pulse insertion as described above.

Summarily, the pulse phase-modulation profile pulse insertion method described herein allows for a purely digital, simple circuit implementation to perform SSCG, without considerable system issue limitations affecting circuit implementation. In addition, the circuit required to perform the phase modulation profile pulse insertion may be achieved at lower costs than previous circuits as it requires fewer components, resulting in lower occupied area on the integrated circuit (IC), lower power consumption and lower capacitance value for the loop filter. The use of phase modulation instead of frequency modulation, while providing optimized spread spectrum solution for clock jitter, also leads to enhanced performance. Finally, pulse phase-modulation profile pulse insertion implementations, as described above, are capable of providing down spread modulation profiles with a PM solution, which is missing in traditional PM implementations.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A method for generating a clock signal with reduced electromagnetic interference (EMI), the method comprising:
   receiving a first clock signal, wherein the first clock signal has a first frequency spectrum;
   modulating the first clock signal using phase modulation to produce a second clock signal, wherein said modulating comprises providing a phase modulation profile corresponding to an integrated frequency modulation profile of said modulating, to adjust a scaling factor N used in obtaining the second clock signal from the first clock signal;
   wherein the second clock signal has a second wider frequency spectrum; and
   wherein the second clock signal results in reduced electromagnetic interference compared with the first clock signal.

2. The method of claim 1, wherein the phase modulation profile corresponds to a second order integration curve of the integrated frequency modulation profile.

3. The method of claim 1, wherein said providing the phase modulation profile comprises injecting a specified phase error at an output of a phase frequency detector (PFD) in a phase-locked loop configured to perform said modulating.

4. The method of claim 3, wherein said injecting is performed at least once for each period of said modulating.

5. The method of claim 3, wherein said injecting the specified phase error comprises applying phase modulation profile pulses at the output of the PFD.

6. The method of claim 5, further comprising obtaining the phase modulation profile pulses from a lookup table.

7. The method of claim 5, further comprising generating the phase modulation profile pulses using a counter.

8. The method of claim 5, wherein said applying the phase modulation profile pulses is performed at a specified first frequency.

9. The method of claim 5 further comprising performing said applying the phase modulation profile pulses via:
   pulse density modulation (PDM); or
   pulse width modulation (PWM).

10. The method of claim 9;
   wherein said applying the phase modulation profile pulses via PDM comprises applying a different number of pulses each time said applying the phase modulation profile pulses is performed, wherein a pulse-length of each of the different number of pulses is the same; and wherein said applying the phase modulation profile pulses via PWM comprises applying a single pulse each time said applying the phase modulation profile pulses is performed, and changing a length of the single pulse each time said applying the single pulse is performed.

11. A system for generating a clock signal with reduced electromagnetic interference (EMI), the system comprising:
an input for receiving a first clock signal, wherein the first clock signal has a first frequency spectrum;
a first circuit configured to modulate the first clock signal using phase modulation, and operable to produce a second clock signal, wherein in modulating the first clock signal the first circuit is operable to receive a phase modulation profile corresponding to a desired integrated frequency modulation profile, to control a scaling factor N used in obtaining the second clock signal from the first clock signal; and
an output configured to provide the second clock signal;
wherein the second clock signal has a second wider frequency spectrum; and
wherein the second clock signal results in reduced electromagnetic interference compared with the first clock signal.

12. The system of claim 11, wherein the first circuit comprises a phase locked loop (PLL) having an input configured as the input of the system, and having an output configured as the output of the system.

13. The system of claim 12, wherein the PLL comprises a phase frequency detector (PFD) configured to receive the first clock signal, wherein the first circuit is configured to receive the phase modulation profile in form of one or more phase modulation profile pulses injected at the output of the PFD.

14. The system of claim 13, wherein the PLL comprises a loop filter coupled to the PFD and operable to filter out at least an input reference spur.

15. The system of claim 14, wherein the loop filter is a third-order filter.

16. The system of claim 13, wherein a bandwidth of the PLL is substantially less than an operating frequency of the PFD.

17. The system of claim 13, wherein for each modulation period of the phase modulation the one or more phase modulation profile pulses correspond to a PFD output phase error.

18. The system of claim 17, wherein the one or more phase modulation profile pulses correspond to a phase profile identical to a second order integration curve of a frequency modulation profile that corresponds to the phase modulation.

19. The system of claim 13, wherein the one or more phase modulation profile pulses correspond to one or more previously specified phase error values.

20. A phase locked loop comprising:
a phase frequency detector (PFD) having an output and configured to receive a first clock signal having a first frequency spectrum, wherein the PFD is configured to receive at its output a phase modulation profile, and is operable to phase modulate the first clock signal according to the phase modulation profile to produce a modulated first clock signal;
a loop filter (LF) having an input coupled to the output of the PFD and operable to filter out an input reference spur from the modulated first clock signal; and
a voltage controlled oscillator (VCO) having an input coupled to an output of the LF and operable to provide a second clock signal based on the filtered modulated first clock signal;
wherein the second clock signal has a second wider frequency spectrum; and
wherein the second clock signal results in reduced electromagnetic interference compared with the first clock signal.

* * * * *